United States Patent [19]

Lozowski

[11] 4,092,591

[45] May 30, 1978

[54] ELECTRIC METER

[76] Inventor: Joseph F. Lozowski, 4753 58th St. N., St. Petersburg, Fla. 33709

[21] Appl. No.: 602,217

[22] Filed: Aug. 6, 1975

[51] Int. Cl.² ................. G01R 1/36; G01R 15/12
[52] U.S. Cl. ................................ 324/110; 324/62; 324/115
[58] Field of Search .............. 324/115, 110, 123 R, 324/122, 62 R; 361/91

[56] References Cited

U.S. PATENT DOCUMENTS

| | | | |
|---|---|---|---|
| 2,648,820 | 8/1953 | Miller | 324/110 |
| 3,024,388 | 3/1962 | Blitchington, Jr. | 324/110 |
| 3,392,332 | 7/1968 | Christensen | 324/110 |
| 3,440,538 | 4/1969 | Riley | 324/123 R |
| 3,536,998 | 10/1970 | Nordholm | 324/110 |
| 3,588,609 | 6/1971 | Keen | 324/110 |
| 3,667,041 | 5/1972 | Senour | 324/123 R |
| 3,825,827 | 7/1974 | Tumbush | 324/122 |

FOREIGN PATENT DOCUMENTS 854,824  11/1952  Germany .................. 324/110

Primary Examiner—Rudolph V. Rolinec
Assistant Examiner—Ernest F. Karlsen
Attorney, Agent, or Firm—Robert F. Ruemeli

[57] ABSTRACT

A combined electric meter for measuring AC and DC voltage and ohms is provided with read-outs having indicators progressively actuated for simultaneously indicating AC and DC voltages and for indicating ohms. The read-outs are in the form of light emitting diodes in which the lights are progressively illuminated to indicate a range of voltage or ohms. A pair of probes are manually connected to the circuit to be tested and provide a common connection for the voltage and ohm section of the meter. Should voltage be sensed by the probes, the ohmmeter section is automatically taken out of circuit to protect it from damage. A high speed switch transistor is responsive to an external voltage across the probes for opening the ohmmeter circuit before the external voltage can cause damage to the ohmmeter. The meter has an internal power supply for operating the read-outs and providing a regulated voltage for a resistance to be measured by the ohmmeter section.

8 Claims, 2 Drawing Figures

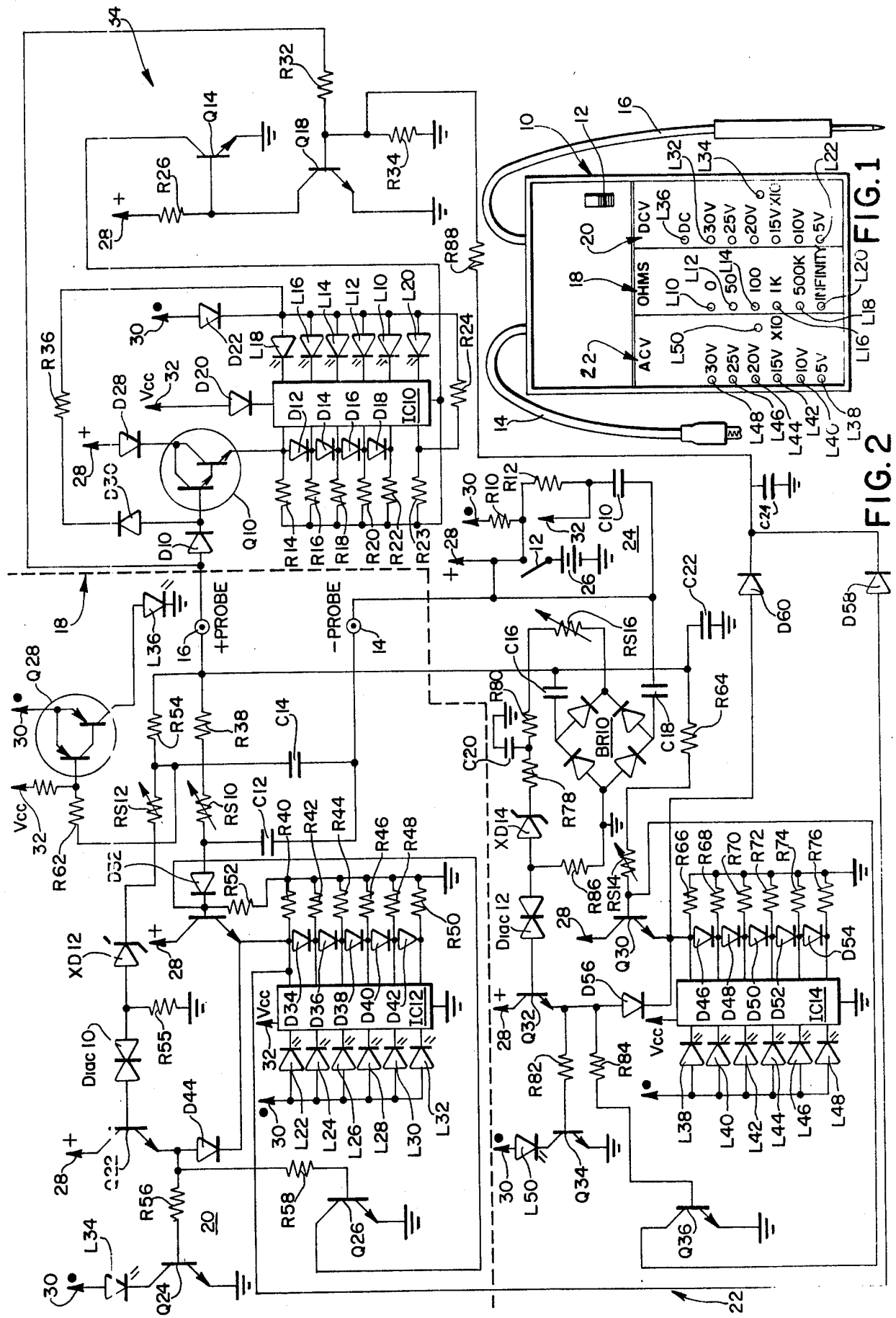

ELECTRIC METER

This invention relates to an electric meter and, more particularly, to a combined meter for measuring AC and DC voltage and ohms and protecting the ohmmeter when an external voltage is applied to the meter.

BACKGROUND OF THE INVENTION

In servicing major home appliances such as electric ovens and ranges, refrigerators and freezers, and the like, it is usually necessary to test the electric circuits in order to isolate the problem requiring servicing. The environment in which the serviceman must often work is not necessarily good and is often cramped with poor illumination, and there results a great tendency to burn out the electric meters used for testing the circuits. Combined voltage and ohmmeters have been proposed to obviate some of the present difficulties, but meters continue to be burned out at an excessively high rate. One of the major causes of damage to combined meters is that when the meter probes are connected into a live circuit the protection afforded the ohmmeter portion is often inadequately responsive to prevent the external voltage from damaging the ohmmeter. Also, the voltages which must be tested range from very low voltage such as five volts, to relatively high voltage such as three hundred volts, so that stepping volt meters are generally required, and often the serviceman must set the meter at approximately the correct voltage to be tested, but if the set range is far too low the meter will be damaged. In view of the often poor working conditions it may be difficult to read the meter, particularly the typical swing-type meter which is unnecessarily accurate and costly for use in servicing typical home appliances and usually require manual operation of stepping means for setting the meter in the correct range.

A combined volt-ohmmeter is shown in a U.S. Patent No. 3,536,998, in which a circuit for protecting the meter against excessive voltage is provided, but this circuit relies on relays which are too slow operating to provide dependable protection. Various protective systems are shown in relatively early patents including U.S. Pat. No. 3,023,326, and U.S. Pat. No. 3,024,388, both granted in 1962 and filed in the late fifties in which transistors are used for switching. A protective circuit utilizing a semiconductor is shown in U.S. Pat. No. 3,343,085, and a semiconductor switching device is shown in U.S. Pat. No. 3,066,258. A millivolt drop indicator utilizing transistors is shown in U.S. Pat. No. 3,392,332, and a diode limiter is shown in U.S. Pat. Nos. 2,964,650. 3,657,649, shows a relatively simple range switching system, and light emitting diode circuits are shown in U.S. Pat. Nos. 3,795,863, and 3,796,951.

BRIEF DESCRIPTION OF THE INVENTION

The invention, in brief, is directed to a combined meter for measuring both voltage and ohms and for protecting the ohm measuring system from external voltage applied to the meter. Separate read-outs for AC voltage, DC voltage, and ohms are provided, and completely automatic switching of ranges of voltage and ohms is provided. Each of the read-outs has progressively actuated indicators for measuring voltage or ohm ranges as the case may be, and these indicators are in the form of progressively illuminated light emitting diodes. Protection for the ohmmeter section is in the form of an electronic switch including a first transistor normally turned on and closing a circuit from the meter probes to the ohmmeter, and a normally off second transistor in circuit between ground and the base of the first transistor, the second transistor having its base connected in circuit with the probes and responsive to a voltage sensed by the probes to turn on and ground the base of the first transistor, opening the circuit to the ohmmeter. The second transistor is a high speed switch transistor and the electronic switch operates sufficiently rapidly that an external voltage sensed by the probes can not damage the ohmmeter.

It is an object of this invention to provide a new and useful meter for measuring both voltage and ohms and, more particularly, such a meter having a system for protecting an ohmmeter section from external voltage applied to the meter.

Another object is provision of a new and useful meter particularly suitable for use by major appliance servicemen, the meter combining both AC and DC voltage read-outs and an ohm read-out all operative simply by connecting a pair of probes with the circuit to be tested.

Still another object is provision of a new and useful ohmmeter with a system responsive to the meter sensing voltage for protecting the meter against the voltage.

A more specific object is provision of a new and useful combined meter for measuring both voltage and ohms and including a section for measuring ohms and a section for measuring voltage, and a section providing electric power to operate the ohms measuring section, with a circuit for connecting both the power means and both of the measuring sections with a component to be measured, and provision responsive to the connecting circuit sensing voltage for taking the power means and the ohms measuring section out of circuit before the sensed voltage can pass through the ohms measuring section. A related object is provision of such a meter in which the ohms measuring section is taken out of circuit responsive to an electronic switch normally retaining the power section and the ohms measuring section in operative circuit and responsive to the sensed voltage the switch opening the circuit, the switch comprising a first transistor normally turned on and closing the operative circuit from the power section to the ohms measuring section, and a normally off second transistor in circuit between ground and the base of the first transistor, the second transistor having its base connected to turn on responsive to the sensed voltage and to ground the base of the first transistor thereby opening the operative circuit to the ohms measuring section. Another related object is provision of the second transistor in the form of a high speed switch transistor. Still another related object is provision of the voltage section including separate read-outs for simultaneously measuring both AC and DC voltage, the AC read-out being responsive only to AC voltage and the DC read-out being responsive only to DC voltage. A further related object is provision of the read-outs having progressively actuated indicators for indicating the respective measured quantity and, more particularly, the indicators being in the form of light emitting diodes in which the lights are progressively operable in sequence for indicating the associated quantity.

These and other objects and advantages of the invention will be apparent from the following description and the accompanying drawing.

BRIEF DESCRIPTION OF THE DRAWING

FIG. 1 is a facial view of the encased meter; and

FIG. 2 is a circuit diagram of the meter.

DESCRIPTION OF THE ILLUSTRATED EMBODIMENT

Referring to FIG. 1 of the drawing, the meter is contained within a casing 10 and is turned on and off by a switch 12. A negative probe 14 and a positive probe 16 are on flexible wires extending from the top of the casing.

An ohmmeter section 18 of the meter has a read-out with progressively actuated indicators in the form of green, red, and yellow lights, a series of progressively illuminated lights L10-L20 in the form of light emitting diodes including an infinity light (yellow) L20 which is on whenever the meter is on and not measuring resistance or voltage. The light L20 is off when light L18, which indicates 500K ohm resistance is illuminated. The lights progressively light from 500K to Continuity or zero (red) in progressive steps so that when any light is on the resistance is between that indicated by the light and that indicated by the next light to turn on. As these lights turn on they remain illuminated so that the smallest value illuminated light is the indicating light.

The DC voltage section 20 has a similar read-out with red lights including six DC voltage indicating lights L22- L32, a multiplier light L34 which when illuminated indicates that the DC voltage indicated by the lights L22-L32 is multiplied by 10, and a negative DC (yellow) light L36 indicating that the probes 14 and 16 should be reversed. As shown in FIG. 1, the voltage readings increase progressively from 5 volts when light L22 is on to 30 volts when light L32 is on, and when the multiplier (green) light L34 is on and the 30 volt light L32 is on the voltage reading is three hundred volts, with the lower value lights remaining on.

Similarly, the AC voltage indicating section 22 has the same type of read-out with yellow lights including six progressively illuminated AC voltage indicating lights L32- L48 which are illuminated in 5 volt increments, the highest value illuminated light being the indicating light and the smaller value lights remaining on. A multiplier (red) light L50 when illuminated increases the voltage value of the lights L38-L48, as described with reference to the DC voltage indicating section 20.

With reference to FIG. 2, a power supply section 24 of the meter may be of any suitable type and is illustrated in the form of a basic 6 volt supply provided by four "AA" penlight batteries 26 either rechargeable or throw away, with the negative connection to ground, and the positive connection to the switch 12 and to a 6 volt power supply connection 28 indicated by a plus sign and arrow, and also connected with the negative probe 14. When the switch 12 is closed the battery 26 is also connected through a resistance R10 with a voltage supply 30 indicated by a dot and arrow, for operating the light emitting diodes. The battery is also in circuit through the closed switch 12 and a resistance R12 with a five volt integrated circuit voltage supply 32 indicated by Vcc and an arrow, with a condensor C10 as a filter for integrated circuits to be described later.

The ohmmeter section 18 is operative when the switch 12 is closed. Upon positioning the probes 14 and 16 across a resistance, a transistor Q10 which is connected with the positive probe 16 through a diode D10 operates an integrated circuit IC10 which along with diodes D12-D18 and resistances R14-R23 typically connected to the input of IC10 form a voltage divider network which allows transistor Q10 with the integrated circuit IC10 as the driver to progressively light the lights L10-L18, in the form of light emitting diodes typically connected to the output of IC10. As previously noted the infinity resistance light emitting diode (light) L20 is illuminated whenever the meter is turned on, and is also driven by the integrated circuit IC10 and is maintained in on position by a resistance R24, but when any other of the indicator lights L10-L16 are illuminated, light L20 shuts off due to the change in potential on the source side of resistance R24. The integrated circuit IC10 is connected with the integrated circuit voltage 32 through a diode D20, and the light emitting diodes L10-L20 are powered through a diode D22 by the voltage source 30. When resistance is being measured, that is when no external voltage is applied to the probes 14 and 16, resistor R26, connected with the six volt power supply 28, which biases a transistor Q14 of an electronic switch 34 into an on position allowing normal operation of the ohmeter.

When either an AC or DC external voltage is applied to the probes 14 and 16, a high speed switch transistor Q18 (of switch 34) which is connected to the positive probe 16 through resistance R32, is turned on and shuts off transistor Q14 by grounding its base, which in turn isolates the ohmmeter from the seat of the circuit and protects it from potentially damaging external voltages. More particularly, when a voltage is applied across the probes 14 and 16 the base of high speed switch transistor Q8 is energized and grounds the base of transistor Q14, thereby opening the circuit between transistor Q10 and ground so that no current flows through the transistor Q10, thus protecting the ohmmeter section from damage by external AC or DC voltage.

If external voltage is applied to the probes 14 and 16 while the switch 12 is in the open or "off" position, the transistor Q14 is also turned off since the 6 volt supply 28 is off, and thus prevents damage to the ohmmeter section 18. A diode D28 between the collector of the transistor Q10 and the 6 volt power supply 28 provides further protection for the ohmmeter. Diode D30 in series with a resistance R36 between the base of the transistor Q10 and the light emitting diodes L10-L20 provide proper calibration of ohmmeter.

Referring now to the DC voltage section 20, when DC voltage is applied to the probes 14 and 16 it enters the section through resistor R38 and adjustable resistance RS10, and through a diode D32 to the base of a transistor Q20 which controls a second voltage divider network. The voltage divider network includes an integrated circuit IC12, and typically connected to its input diodes D34- D42 and resistors R40-R50. This voltage divider network functions similarly to that of the ohmmeter section 34 for progressively lighting light emitting diodes (lights) L22-L32 on the IC12 output. The diodes D34-D42 are connected in circuit with the emitter of transistor Q20. Resistance R52 is connected from the base of transistor Q20 to ground. The light emitting diodes are connected with the voltage supply 30. This portion of the DC section 20 progressively lights the light emitting diodes L22-L32 in 5 volt increments from zero to thirty volts, and when the voltage exceeds forty volts the multiplier light L34 is illuminated and the lights L22-L32 are turned off until the DC voltage reaches 50 volts whereupon the light L22 is again turned on and the remaining lights are progressively turned on until the voltage reaches three hundred volts at which time the light L32 is again turned on.

When the DC voltage exceeds 40 volts, a zener diode XD12 allows current to flow through resistance R54 and adjustable resistor RS12 and the zener diode XD12 in combination with a 15 volt Diac10 connected with the base of a transistor Q22 to turn on the transistor, the Diac and zener diode functioning as an electronic switch for eliminating spurious readings during transition of the voltage ranges from one to ten. A ground resistor R55 is connected between the zener diode and the Diac. As the transistor Q22 begins to conduct the ten times switching takes place because the transistor Q22 activates transistors Q24 and Q26. The emitter of the transistor Q22 is grounded and its collector is connected in circuit with the multiplier light emitting diode L34 which is powered by the voltage supply 30. The emitter of the transistor Q26 is grounded and its collector is connected with the base of the transistor Q20 to turn off this transistor with the emitter of the transistor Q22 connected through a diode 44 with the diodes D34–D42 so that the light emitting diodes L22–L32 are progressively illuminated to indicate ten times the voltage indicated on the casing 10, that is to indicate 50 through 300 DC volts.

The negative DC indicator light emitting diode L36 is turned on by a transistor Q28 which is a high impedance amplifier activated by a negative DC voltage, whereupon the probes 14 and 16 are reversed to provide a positive DC measurement. The base of the transistor Q28 is in circuit with the integrated circuit voltage supply 32 through a resistor R60 and through a resistor R62 with an AC filter. The AC filter includes condensors C12 and C14 connected in parallel between the negative probe 14 and the supply line to the base of the transistor Q20 as shown in the diagram.

The AC voltage section 22 includes a pair of condensors C16 and C18 which prevent DC voltage from entering the AC section. The condensor C16, as illustrated, is connected in circuit with the positive probe 16 and condensor C18 is connected in circuit with the negative probe 14, these condensors being connected with diagonals of a bridge BR10. Any remaining wave form of pulsating direct current is filtered out by condensors C20 and C22. The filtered current passes through a resistance R64 and an adjustable resistor RS14 to the base of a transistor Q30 having its collector in circuit with the 6 volt power supply 28, and its emitter in circuit with a third voltage divider network including an integrated circuit IC14 and on its input resistances R66–R76 and diodes D46–D54, as shown in the circuit diagram. The network progressively turns on light emitting diodes L38–L48 on the IC14 output, in accordance with the value of the AC voltage. When the AC voltage reaches 40 volts, zener diode XD14 and a second 15 volt Diac12 in circuit with resistances R78 and R80, and adjustable resistance RS16 begin to conduct to the base of a transistor Q32 having its collector in circuit with the 6 volt power supply 28 and its emitter connected through a resistance R82 with the base of a transistor Q34 and also through a resistor R84 with the base of a transistor Q36. A grounded resistor R86 is connected between the zener diode XD14 and the Diac12. The collector of transistor Q34 is connected with the multiplier light emitting diode L50 which is powered through the voltage supply 30 to illuminate this light. When turned on the transistor Q36 which is connected through its collector with the base of transistor Q30 to turn off this transistor, thereby allowing transistor Q32 having its emiter connected through a diode D56 with the associated voltage divider network so that the lights are progressively illuminated in increments in the 50 to 300 volt range with the multiplier light L50 lighted. Diode D56 provides the same function as diode D44 in the DC section 20.

To further prevent damage to the ohmmeter section 18, both the DC and AC voltage divider networks are connected as follows: the DC voltage divider network is connected through a diode D58, and the AC voltage divider network is connected through a diode D60 and a condenser C24 to ground. Both of these diodes are connected through a resistor R88 with the base of transistor Q18, so that when either external AC or DC voltage is present in the circuit the transistor Q18 is turned on to ground the base of transistor Q14 thus taking the ohmmeter section out of the circuit. Condenser C24 provides a short delay of the ohmmeter returning to operation.

The following is a specification of suitable components for a meter as previously described and illustrated:

| Transistors | |
|---|---|
| Q10 Motorola 59100 | Q26 2N2222 |
| Q14 AST5058 | Q28 Motorola 59120 |
| Q18 2N2222 | Q30 2N3565 |
| Q20 2N3565 | Q32 2N3643 |
| Q22 2N3565 | Q34 2N3565 |
| Q24 2N3565 | Q36 2N2222 |

| Zener Diodes | |
|---|---|
| XD12 and XD14 25 volts | |

| Diodes | |
|---|---|
| D10 .5amp 450piv | D38 Germanium IN34 |
| D12 Germanium IN34 | D40 Germanium IN34 |
| D14 Germanium IN34 | D42 Germanium IN34 |
| D16 Germanium IN34 | D44 .5amp 50piv |
| D18 Germanium IN34 | D46 Germanium IN34 |
| D20 .5amp 450piv | D48 Germanium IN34 |
| D22 .5amp 450piv | D50 Germanium IN34 |
| D28 .5amp 450piv | D52 Germanium IN34 |
| D30 .5amp 450piv | D54 Germanium IN34 |
| D32 .5amp 50piv | D56 .5amp 50piv |
| D34 Germanium IN34 | D58 .5amp 50piv |
| D36 Germanium IN34 | D60 .5amp 59piv |

| Capacitors | |
|---|---|
| C10 .47mf 50v | C18 .02mf 450v |
| C12 2.2mf 50v | C20 .1mf 250v |
| C14 .1mf 250v | C22 .03mf 450v |
| C16 .02mf 450v | C24 25mf 6v electrolitic |

| Bridge |
|---|
| BR10 .5amp 450piv |

| Integrated Circuits |
|---|
| IC10-IC14 7404TTL Hex. Invertor 5v Vcc |

| Diacs |
|---|
| Diac10 and Diac12 15v |

| Resistors (all ¼ watt 10%) | |
|---|---|
| R10 200 | R54 1m |
| R12 47 | R55 5.6m |
| R14 1.2K | R56 12K |
| R16 1.2K | R58 12K |
| R18 1.2K | R60 1m |
| R20 1.2K | R62 2.2m |
| R22 1.2K | R64 .5m |
| R23 1.2K | R66 1.2K |
| R24 1.5K | R68 1.2K |
| R26 500 | R70 1.2K |
| R32 470K | R72 1.2K |
| R34 1m | R74 1,2K |
| R38 .5m | R76 1.2K |
| R40 1.2K | R78 1m |
| R42 1.2K | R80 2.2m |
| R44 1.2K | R82 12K |
| R46 1.2K | R84 12K |
| R48 1.2K | R86 5.6m |
| R50 1.2K | R88 2.7k |
| R52 1m | |

| Variable Resistors |
|---|
| RS10-RS16 1meg restat ½ watt |

The only required calibration is done during initial construction. For example, a maximum voltage of the individual range to be calibrated, for example thirty volts is accomplished by applying thirty volts and adjusting adjustable resistor RS10 until all six light emitting diodes L22–L32 are on. No further changes are necessary.

To check the condition of the battery 26, touch the probes 14 and 16 together and if the Continuity or zero ohm light emitting diode L10 is not illuminated there is insufficient battery power.

While this invention has been described and illustrated with reference to a particular embodiment in a particular environment, various changes may be apparent to one skilled in the art and invention is therefore not to be limited to such embodiment or environment except as set forth in the appended claims.

What is claimed is:

1. A combined meter for measuring both voltage and ohms, comprising means for measuring ohms, means for measuring voltage, means for providing electric power to operate the ohms measuring means, means in circuit with the power means and both of the measuring means for connecting the power and measuring means with a component to be measured, and means responsive to the connecting means sensing voltage for taking the power means and the ohms measuring means out of circuit before the sensed voltage can pass through said ohms measuring means, the responsive means comprising switching means normally retaining said power means and ohms measuring means in operative circuit and responsive to said sensed voltage said responsive means opening the last said circuit, and said switching means comprising a first transistor normally turned on and closing said operative circuit from the power means through the ohms measuring means, and a normally off second transistor in circuit between ground and the base of the first transistor, said second transistor having its base connected in circuit with said sensed voltage to turn on responsive to said sensed voltage and ground the base of said first transistor, opening said operative circuit.

2. A meter as set forth in claim 1 in which said second transistor is a high speed switch transistor.

3. A meter as set forth in claim 2 in which the voltage measuring means includes separate means for simultaneous providing independent read-outs of both AC and DC voltage sensed by the connecting means.

4. A meter as set forth in claim 5 in which said separate means includes AC and DC sections measuring only AC and DC voltage, respectively.

5. A meter as set forth in claim 4 in which said ohms measuring means includes a read-out for ohms, and said read-outs each have progressively actuated indicators for indicating the measured quantity.

6. A meter as set forth in claim 5 in which said read-outs are each of a series of light emitting diodes with lights progressively operable in sequence for indicating the associated quantity.

7. An ohmmeter comprising, means operable for measuring ohms, means for providing electric power to operate the measuring means, means in circuit with the power means and the measuring means for connection with a component to be measured, and means responsive to the connecting means sensing voltage for taking the power means and the measuring means out of circuit before the sensed voltage can pass through said measuring means, said responsive means including switching means normally retaining said power means and said measuring means in operative circuit and responsive to the sensed voltage opening said operative circuit, and said switching means including a first transistor normally turned on and closing said operative circuit from the power means through the measuring means, and a normally off second transistor in circuit between ground and the base of the first said transistor, said second transistor having its base connected in circuit with said sensed voltage to turn on responsive to said sensed voltage and ground the base of said first transistor, opening said operative circuit.

8. A meter as set forth in claim 7 in which said second transistor is a high speed switch transistor.

* * * * *